(12) United States Patent
Huang et al.

(10) Patent No.: US 10,984,704 B2
(45) Date of Patent: Apr. 20, 2021

(54) DISPLAY DEVICE

(71) Applicant: Au Optronics Corporation, Hsinchu (TW)

(72) Inventors: Yu-Sheng Huang, Kaohsiung (TW); Ching-Yi Hsu, Hsinchu (TW); Kuan-Hsun Chen, Hsinchu (TW); Hong-Sian Chi, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/658,127

(22) Filed: Oct. 20, 2019

(65) Prior Publication Data

US 2020/0335030 A1    Oct. 22, 2020

(30) Foreign Application Priority Data

Apr. 19, 2019  (TW) .................................. 108113788

(51) Int. Cl.
*G09G 3/32* (2016.01)
*H01L 25/16* (2006.01)

(52) U.S. Cl.
CPC .............. *G09G 3/32* (2013.01); *H01L 25/167* (2013.01); *G09G 2300/08* (2013.01); *G09G 2320/0209* (2013.01); *G09G 2330/02* (2013.01)

(58) Field of Classification Search
CPC ............. G09G 3/32; G09G 2320/0209; G09G 2300/08; G09G 2330/02; H01L 25/167
See application file for complete search history.

(56) References Cited

U.S. PATENT DOCUMENTS

| 2018/0190182 A1 | 7/2018 | Li et al. | |
| 2018/0247609 A1* | 8/2018 | Joshi | G09G 3/3426 |
| 2018/0301106 A1* | 10/2018 | Huang | G09G 3/3688 |

\* cited by examiner

*Primary Examiner* — Kenneth B Lee, Jr.
(74) *Attorney, Agent, or Firm* — JCIPRNET (57) ABSTRACT

A display device is provided. The display device includes a data signal transmitter and a display panel. The data signal transmitter is used to transmit data signals. A display area of the display panel is divided into sub-display areas. Each sub-display area includes light emitting diodes, a data line, column switches, and row switches. A portion of the data line is formed as a data induction coil to receive one of the data signals by wireless sensing. The display panel selects one of the light emitting diodes as a selected light emitting diode by the column switches and the row switches. The selected light emitting diode is coupled to the data line to form a closed loop. The closed loop generates an induced current according to the data signal and causes the selected light emitting diode to emit light according to the induced current.

24 Claims, 9 Drawing Sheets

DISPLAY DEVICE

CROSS-REFERENCE TO RELATED APPLICATION

This application claims the priority benefit of Taiwan application serial no. 108113788, filed on Apr. 19, 2019. The entirety of the above-mentioned patent application is hereby incorporated by reference herein and made a part of this specification.

BACKGROUND

Technical Field

The disclosure relates to a display device, and in particular, to a light emitting diode (LED) display device that avoids crosstalk.

Description of Related Art

In general, a passive matrix (PM) LED display device is driven by providing scan signals to a plurality of scan lines to select and drive one column of LEDs of the LED display device. In addition, a plurality of data lines of the LED display device provide different pulse width modulation signals to determine the luminance of the selected column of LEDs. Therefore, a PM LED display device does not require a thin-film transistor (TFT) beside the LED. Therefore, the PM LED display device has the advantages of being easy to manufacture at a low cost.

However, in the foregoing driving mode, a large amount of forward current is generated in a large-area PM light-emitting diode display device when the selected column of LEDs are driven. Once a forward leakage current is excessive, the excessive forward leakage current may result in light emission of an LED not expected to emit light. The phenomenon is referred to as crosstalk.

In existing methods, the PM LED display device eliminates the occurrence of crosstalk by reducing the resolution, such as a designed resolution of QVGA (240×320). As a consequence, the resolution of the PM LED display device tends to be not high.

SUMMARY

The disclosure provides a novel display device that avoids crosstalk and achieves high resolution.

A display device according to an embodiment of the disclosure includes a data signal transmitter and a display panel. The data signal transmitter is configured to transmit a plurality of data signals. A display area of the display panel is divided into a plurality of sub-display areas. The sub-display areas are arranged in a two-dimensional array. Each sub-display area includes a plurality of LEDs, a data line, a plurality of column switches, and a plurality of row switches. The LEDs are arranged in a two-dimensional array. A portion of the data line is formed as a data induction coil to receive one of the data signals by wireless sensing. The column switches and the row switches are coupled between the data line and a plurality of corresponding LEDs respectively. The display panel selects one of the LEDs as a selected LED by the row switches and the column switches. The selected LED is coupled to the data line to form a closed loop. The closed loop generates an induced current according to one of the data signals and causes the selected LED to emit light according to the induced current.

A display device according to an embodiment of the disclosure includes a data signal transmitter and a display panel. The data signal transmitter is configured to transmit a plurality of data signals. A display area of the display panel is divided into a plurality of sub-display areas, and the sub-display areas are arranged in a two-dimensional array. The sub-display areas are provided on a first surface of a substrate in the display panel. Each sub-display area includes a connection layer, a plurality of LEDs, a data receiving layer, and a switch layer. The LEDs are arranged in a two-dimensional array and respectively provided on an electrical connection surface of the connection layer. The data receiving layer includes a data line. A portion of the data line is formed as a data induction coil to receive the data signal by wireless sensing. The switch layer includes a plurality of column switches and a plurality of row switches. The column switches and the row switches are coupled between the data line and a plurality of corresponding LEDs respectively. The display panel selects one of the plurality of LEDs as a selected LED by the row switches and the column switches. The selected LED is coupled to the data line to form a closed loop. The closed loop generates an induced current according to the data signal and causes the selected LED to emit light according to the induced current.

Based on the foregoing, in the disclosure, the display area of the display panel is divided into the sub-display areas. Each sub-display area includes the LEDs, the data line, the column switches, and the row switches. In the disclosure, one of the LEDs is selected as the selected LED by the row switches and the column switches. The selected LED is coupled to the data line to form a closed loop to cause the selected LED to emit light according to the induced current. In this way, the display device of the disclosure can avoid crosstalk and meet the design requirements of high resolution.

In order to make the aforementioned and other objectives and advantages of the disclosure comprehensible, embodiments accompanied with figures are described in detail below.

DESCRIPTION OF THE EMBODIMENTS

Some embodiments of the disclosure will be described in detail below with reference to the accompanying drawings.

For reference symbols used in the following descriptions, same reference symbols in different drawings represent same or similar components. These embodiments are merely a part of the present disclosure, and do not disclose all possible implementations of the disclosure. More specifically, these embodiments are merely examples of a method, a system, and an apparatus in the claims of the disclosure.

Figure 1:
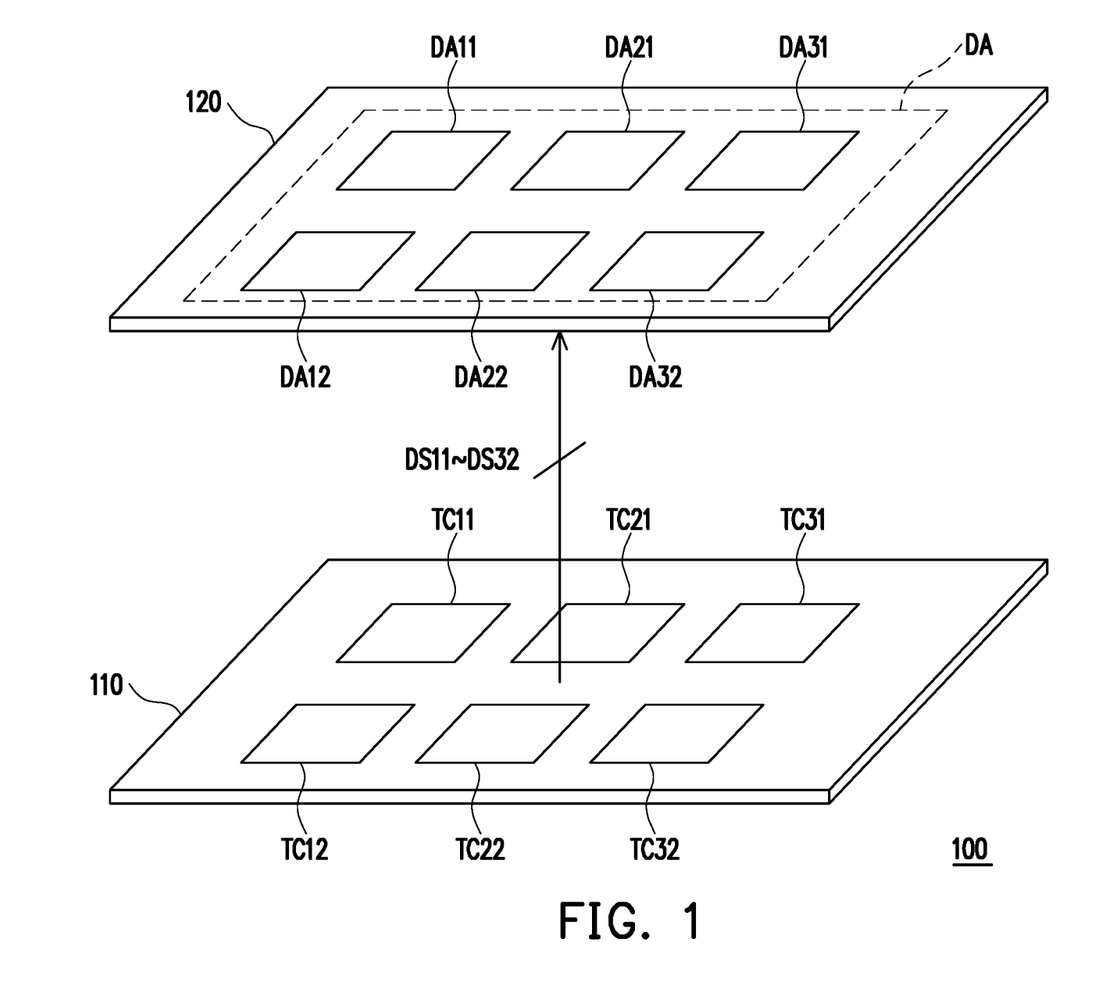
FIG. 1 is a schematic view of a display device according to a first embodiment of the disclosure.
Figure 2:
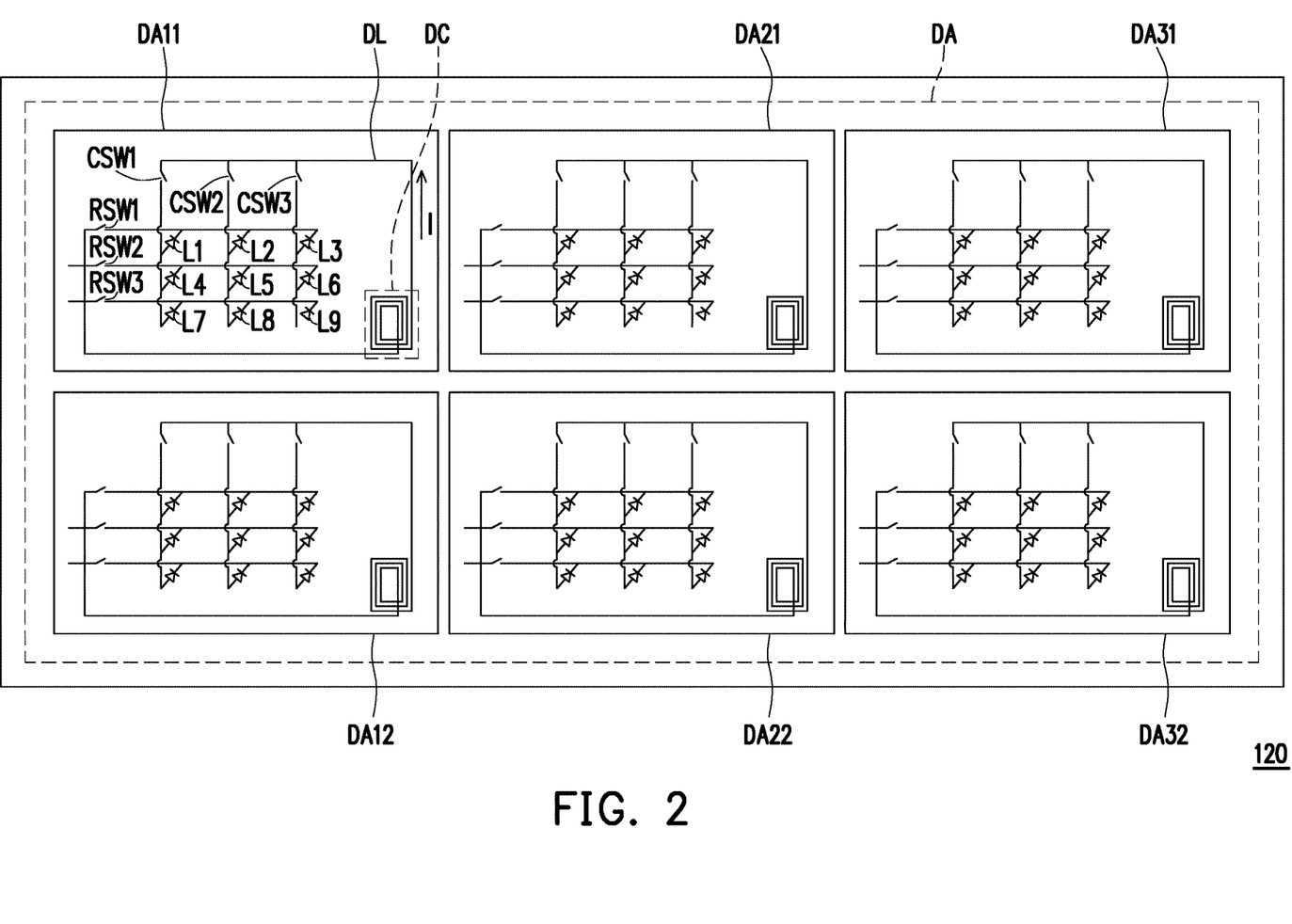
FIG. 2 is a schematic view of a display panel according to the first embodiment of the disclosure.

Referring to FIG. 1 and FIG. 2 simultaneously, FIG. 1 is a schematic view of a display device according to a first embodiment of the disclosure. FIG. 2 is a schematic view of a display panel according to the first embodiment of the disclosure. In the present embodiment, a display device 100 includes a data signal transmitter 110 and a display panel 120. The data signal transmitter 110 is configured to transmit data signals DS11-DS32. A display area DA of the display panel 120 is divided into sub-display areas DA11-DA32. The sub-display areas DA11-DA32 are arranged in a two-dimensional array. The display panel 120 may receive the data signals DS11-DS32 from the data signal transmitter 110 by wireless sensing.

In the present embodiment, the sub-display area DA11 is exemplified preferentially. The sub-display area DA11 includes LEDs L1-L9, a data line DL, column switches CSW1-CSW3, and row switches RSW1-RSW3. The LEDs L1-L9 are arranged in a two-dimensional array. For example, the LEDs L1-L3 are configured as a first row. The LEDs L4-L6 are configured as a second row. The LEDs L7-L9 are configured as a third row. The LEDs L1, L4, L7 are configured as a first column. The LEDs L2, L5, L8 are configured as a second column. The LEDs L3, L6, L9 are configured as a third column. The LEDs L1-L9 may be implemented as organic light-emitting diodes (OLEDs), micro LEDs or mini LEDs. A portion of the data line DL is formed as a data induction coil DC. The data induction coil DC may receive the data signal DS11 among the data signals DS11-DS32 by wireless sensing.

In the present embodiment, the column switch CSW1 is coupled between the data line DL and the LEDs L1, L4, L7. The column switch CSW2 is coupled between the data line DL and the LEDs L2, L5, L8. The column switch CSW3 is coupled between the data line DL and the LEDs L3, L6, L9. In detail, the column switch CSW1 is coupled between the data line DL and anodes of the LEDs L1, L4, L7. The column switch CSW2 is coupled between the data line DL and anodes of the LEDs L2, L5, L8. The column switch CSW3 is coupled between the data line DL and anodes of the LEDs L3, L6, L9. The row switch RSW1 is coupled between the data line DL and the LEDs L1-L3. The row switch RSW2 is coupled between the data line DL and the LEDs L4-L6. The row switch RSW3 is coupled between the data line DL and the LEDs L7-L9. In detail, the row switch RSW1 is coupled between the data line DL and cathodes of the LEDs L1-L3. The row switch RSW2 is coupled between the data line DL and cathodes of the LEDs L4-L6. The row switch RSW3 is coupled between the data line DL and cathodes of the LEDs L7-L9. For convenience of description, the present embodiment is exemplified with nine LEDs, three column switches, and three row switches. The numbers of the LEDs, the column switches, and the row switches of the disclosure may be plural, and shall not be limited by the present embodiment.

In the present embodiment, the display panel 120 may select one of the LEDs L1-L9 as a selected LED by the column switches CSW1-CSW3 and the row switches RSW1-RSW3. For example, in a time interval, the display panel 120 may turn on the column switch CSW1 and the row switch RSW1 and turn off the column switches CSW2 and CSW3 and the row switches RSW2, RSW3 to select the LED L1. The LED L1 is taken as the selected LED. The LED L1 may be coupled to the data line DL to form a closed loop. The closed loop generates an induced current I according to the data signal DS11 and causes the LED L1 to emit light according to the induced current I. In another time interval, the display panel 120 may turn on the column switch CSW1 and the row switch RSW2 and turn off the column switches CSW2, CSW3 and the row switches RSW1, RSW3 to select the LED L4. The LED L4 is taken as the selected LED. The LED L4 may be coupled to the data line DL to form a closed loop to cause the selected LED L4 to emit light according to the induced current I, and so on. Therefore, in the foregoing example, the LEDs L1-L9 in the sub-display area DA11 may emit light in sequence, and do not emit light simultaneously. Sufficient teaching for the implementation of the remaining sub-display areas (i.e., sub-display areas DA12-DA32) can be attained from the example of the sub-display area DA11, and therefore details in this regard will not be repeated in the following.

In the present embodiment, the data signal transmitter 110 may include transmitting coils TC11-TC32. The transmitting coils TC11-TC32 are respectively configured to transmit the data signals DS11-DS32 and are respectively configured corresponding to the data induction coils DC of the sub-display areas DA11-DA32. For example, the transmitting coil TC11 is configured to transmit the data signal DS11, and the transmitting coil TC11 is configured corresponding to the data induction coil DC of the sub-display area DA11. The transmitting coil TC21 is configured to transmit the data signal DS21, and the transmitting coil TC21 is configured corresponding to the data induction coil DC of the sub-display area DA21, and so on.

The display area of the display panel 120 is divided into the sub-display areas DA11-DA32 in the present embodiment. The display panel 120 selects one of the LEDs L1-L9 as the selected LED by the column switches CSW1-CSW3 and the row switches RSW1-RSW3. The selected LED is coupled to the data line DL to form a closed loop to cause the selected LED to emit light according to the induced current I. Therefore, a forward leakage current of the display panel 120 may be dispersed because of the sub-display areas DA11-DA32. In this way, the display device 100 can avoid the occurrence of crosstalk and meet the design requirements of high resolution.

Figure 3:
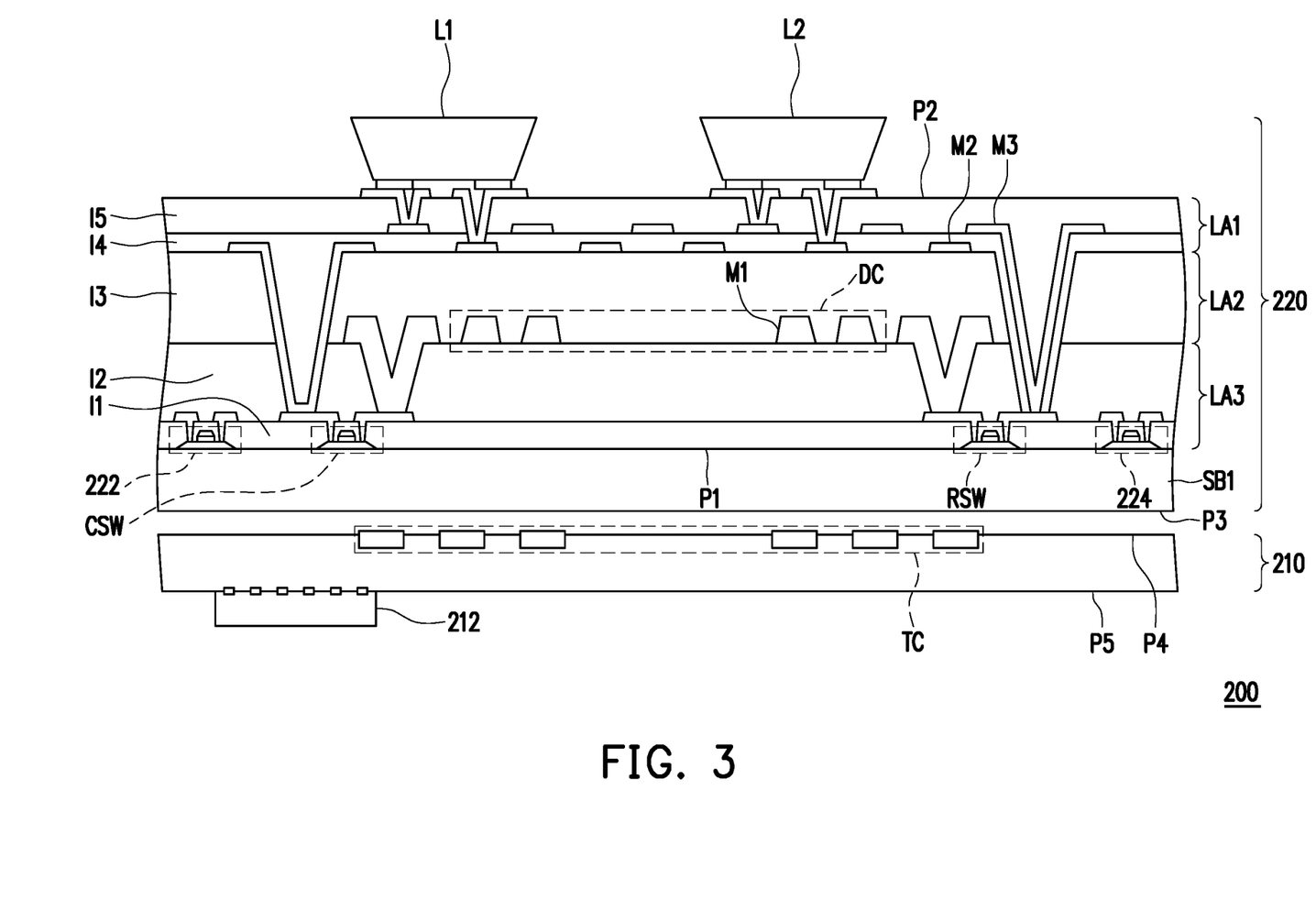
FIG. 3 is a schematic cross-sectional view of a display device according to a second embodiment of the disclosure.

Referring to FIG. 3, FIG. 3 is a schematic view of a display device according to a second embodiment of the disclosure. A display device 200 includes a data signal transmitter 210 for transmitting a plurality of data signals and a display panel 220. In the present embodiment, a display area of the display panel 220 is divided into a plurality of sub-display areas. The sub-display areas are arranged in a two-dimensional array. In the present embodiment, the display device 200 is represented with a partial cross-sectional structure. The display panel 220 is represented with a single sub-display area. The foregoing sub-display area may be, for example, one of the sub-display areas DA11-DA32 of FIG. 1 and FIG. 2. The sub-display areas are provided on a first surface P1 of a substrate SB1 in the display panel 220. The substrate SB1 may be, for example, a glass substrate. In the present embodiment, the sub-display area includes a connection layer LA1, LEDs L1, L2, a data receiving layer LA2, and a switch layer LA3. The LEDs L1, L2 are provided on an electrical connection surface P2 of the connection layer LA1 respectively. The data receiving layer LA2 includes the data line DL. A portion of the data line DL is formed as a data induction coil DC to receive a data signal by wireless sensing. The switch layer LA3 includes a plurality of column switches and a plurality of row switches. For convenience of description, from the perspective of a cross-sectional structure of a sub-display area of the present embodiment, as an example, the number of the LEDs that are visible is 2, and the numbers of the column switches and the number of the row switches that are visible are 1, respectively. On the cross-sectional structure of the sub-display area of the disclosure, the numbers of the LEDs, the column switches, and the row switches may be plural, and shall not be limited by the present embodiment.

In the present embodiment, the column switch CSW and the row switch RSW in the switch layer LA3 are coupled between the data line DL and a plurality of corresponding LEDs respectively. The display panel 220 may select one of the LEDs L1, L2 as a selected LED by the column switch CSW and the row switch RSW, and the selected LED is coupled to the data line DL to form a closed loop. The closed loop generates an induced current according to one of the data signals and causes the selected LED to emit light according to the induced current. For example, the display panel 220 may select the LED L1 in the LEDs L1, L2 as the selected LED by the column switch CSW and the row switch RSW. The display panel 220 may select the LED L2 as the selected LED by the column switch CSW and another row switch (not shown). Therefore, the LEDs L1, L2 are selected one by one and do not emit light simultaneously. In this way, the display device 200 can avoid the occurrence of crosstalk to meet the design requirements of high resolution.

In the present embodiment, the data receiving layer LA2 and the switch layer LA3 are provided between the internal connection layer LA1 and the first surface P1. In detail, the switch layer LA3 is formed on the first surface P1. The switch layer LA3 includes the column switch CSW and the row switch RSW formed by a TFT, and insulating layers I1, I2. The data receiving layer LA2 is formed on the switch layer LA3. The data receiving layer LA2 includes a patterned metal layer M1 and an insulating layer I3. The data receiving layer LA2 may form the data induction coil DC of the data line by the patterned metal layer M1. The data line is electrically isolated from the column switch CSW and the row switch RSW by the insulating layers I1, I2. The data line may be electrically coupled to the column switch CSW and the row switch RSW of the switch layer LA3 by an inner connection structure of the switch layer LA3 and an inner connection structure of the data receiving layer LA2. The inner connection structure may include a via and a patterned conductive layer. For example, the data line may be coupled between a first end of the column switch CSW and a first end of the row switch RSW via the internal connection structure.

The connection layer LA1 is formed on the data receiving layer LA2. The connection layer LA1 includes patterned metal layers M2, M3, insulating layers I4, I5, and a plurality of vias. The LEDs L1, L2 may be electrically coupled to the patterned metal layers M2, M3 by a plurality of vias on the electrical connection surface P2, and the LEDs L1, L2 are electrically coupled to the column switch CSW and the row switch RSW by a plurality of internal connection structures provided between the switch layer LA3 and the connection layer LA1. In the foregoing example, an anode of the LED L1 may be coupled to a second end of the column switch CSW via the patterned metal layer M2 and the via. A cathode of the LED L1 may be coupled to a second end of the row switch RSW via the patterned metal layer M3 and the via. An anode of the LED L2 may be coupled to a second end of the column switch CSW via the patterned metal layer M2 and the via. A cathode of the LED L2 may be coupled to a second end of another row switch via the patterned metal layer M3 and the via.

In the present embodiment, the substrate SB1 of the display panel 220 includes a second surface P3 opposite to the first surface P1. The second surface P3 may be regarded as a back surface of the display panel 220. The data signal transmitter 210 includes a substrate SB2 and transmitting coils TC for transmitting data signals. The transmitting coils TC are provided on a first surface P4 of the substrate SB2 or embedded in the first surface P4 of the substrate SB2. The first surface P4 of the substrate SB2 may be configured to face the second surface P3 of the display panel 220, so that the sub-display areas and the transmitting coils TC may conduct one-to-one wireless data transmission.

The data signal transmitter 210 also includes a data signal generator 212 for generating data signals. The data signal generator 212 is provided on a second surface P5 opposite to the first surface P4.

In some embodiments, a column gate driving circuit 222 and a row gate driving circuit 224 are further included in the switch layer LA3 of the sub-display area. The column gate driving circuit 222 is configured to generate a plurality of column gate driving signals, and provide one of the plurality of column gate driving signals to the column switch CSW. The row gate driving circuit 224 is configured to generate a plurality of row gate driving signals, and provide one of the plurality of row gate driving signals to the row switch RSW. The implementation details of the column gate driving circuit and the row gate driving circuit of the disclosure will be described in detail in FIG. 4.

Figure 4:
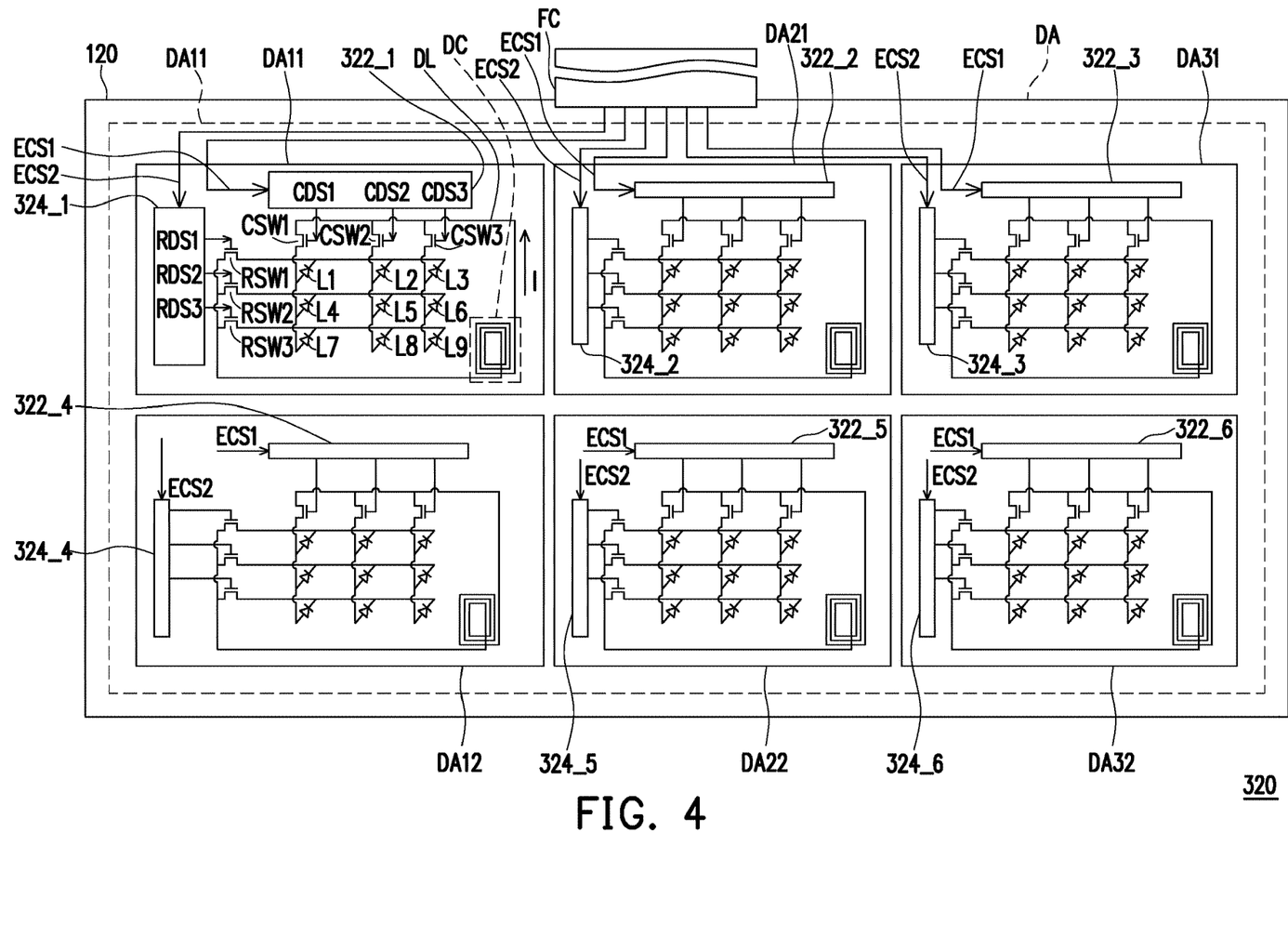
FIG. 4 is a schematic view of a display panel according to a third embodiment of the disclosure.

Referring to FIG. 4, FIG. 4 is a schematic view of a display panel according to a third embodiment of the disclosure. In the present embodiment, the display area DA of a display panel 320 is divided into the sub-display areas DA11-DA32. The sub-display area DA11 of the display panel 320 includes the LEDs L1-L9, the data line DL, the column switches CSW1-CSW3, the row switches RSW1-RSW3, a column gate driving circuit 322_1, and a row gate driving circuit 324_1. Sufficient teaching for the implementation details of the LEDs L1-L9, the data line DL, the column switches CSW1-CSW3, and the row switches RSW1-RSW3 of the present embodiment can be attained from the LEDs L1-L9, the data line DL, the column switches CSW1-CSW3, and the row switches RSW1-RSW3 of the first embodiment and therefore will not be repeated in the following.

In the present embodiment, the column gate driving circuit 322_1 is coupled to the column switches CSW1-CSW3. The column gate driving circuit 322_1 generates column gate driving signals CDS1-CDS3. The column gate driving circuit 322_1 provides the column gate driving signal CDS1 to a control terminal of the column switch CSW1, provides the column gate driving signal CDS2 to a control terminal of the column switch CSW2, and provides the column gate driving signal CDS3 to a control terminal of the column switch CSW3. The display panel 320 may control the column switch CSW1 to be turned on or off by the column gate driving signal CDS1, control the column switch CSW2 to be turned on or off by the column gate driving signal CDS2, and control the column switch CSW3 to be turned on or off by the column gate driving signal CDS3.

The row gate driving circuit 324_1 is coupled to the row switches RSW1-RSW3. The row gate driving circuit 324_1 generates row gate driving signals RDS1-RDS3. The row gate driving circuit 324_1 provides the row gate driving signal RDS1 to a control terminal of the row switch RSW1, provides the row gate driving signal RDS2 to a control terminal of the row switch RSW2, and provides the row gate driving signal RDS3 to a control terminal of the row switch RSW3. The display panel 320 may control the row switch RSW1 by the row gate driving signal RDS1, control the row switch RSW2 by the row gate driving signal RDS2, and control the row switch RSW3 by the row gate driving signal RDS3.

The column gate driving circuit 322_1 may receive an external control signal ECS1 via a circuit interface and is driven according to the external control signal ECS1. The row gate driving circuit 324_1 may also receive an external control signal ECS2 via the circuit interface and is driven according to the external control signal ECS2. In the present embodiment, the column gate driving circuit 322_1 may receive the external control signal ECS1 via a flexible printed circuit (FPC) FC and be driven according to the external control signal ECS1. The row gate driving circuit 324_1 may also receive the external control signal ECS2 via the FC and be driven according to the external control signal ECS2. The external control signals ECS1, ECS2 may respectively include at least a signal such as a clock signal and a power voltage. The column gate driving circuit 322_1 generates the column gate driving signals CDS1-CDS3 according to the external control signal ECS1. The row gate driving circuit 324_1 generates the row gate driving signals RDS1-RDS3 according to the external control signal ECS2. Similarly, the column gate driving circuits 322_2-322_6 of the remaining sub-display areas DA12-DA32 receive the external control signal ECS1 via the FC, and are driven according to the external control signal ECS1. The row gate driving circuits 324_2-324_6 of the remaining sub-display areas DA12-DA32 receive the external control signal ECS2 via the FC, and are driven according to the external control signal ECS2.

Figure 5A:
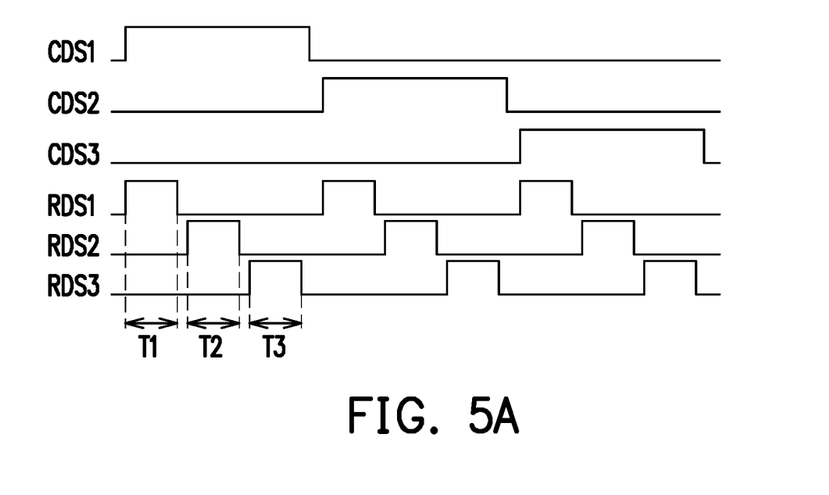
FIG. 5A is a waveform diagram of a column gate driving signal and a row gate driving signal according to an embodiment of the disclosure.
Figure 5B:
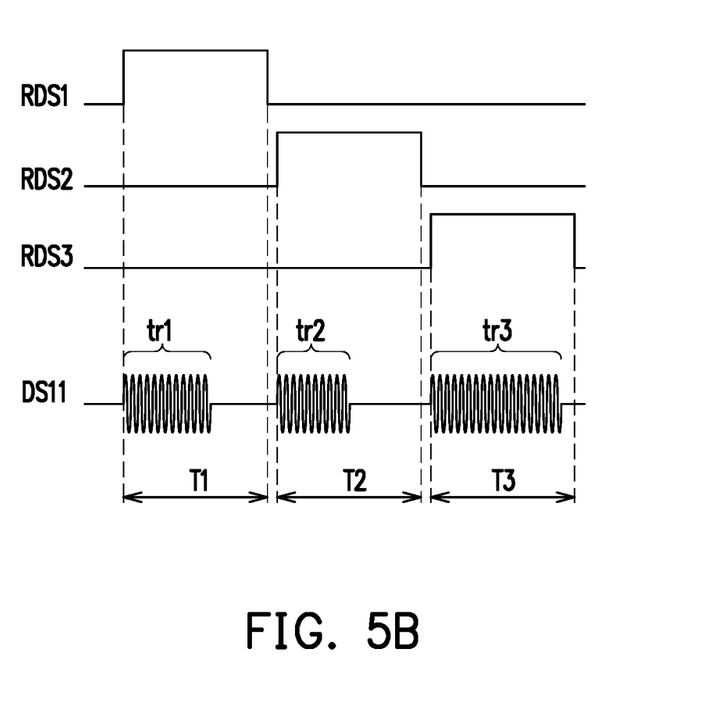
FIG. 5B is a waveform diagram of a row gate driving signal and a column gate driving signal according to FIG. 5A.

The implementation details of the column gate driving signals, the row gate driving signals, and the data signals are described in detail. Referring to FIG. 4, FIG. 5A, and FIG. 5B simultaneously, FIG. 5A is a waveform diagram of a column gate driving signal and a row gate driving signal according to an embodiment of the disclosure. FIG. 5B is a waveform diagram of a row gate driving signal and a column gate driving signal according to FIG. 5A. In the present embodiment, a duty cycle of the column gate driving signals CDS1-CDS3 is greater than a duty cycle of the row gate driving signals RDS1-RDS3. A positive pulse width of the column gate driving signals CDS1-CDS3 is greater than or equal to the cycle of the row gate driving signals RDS1-RDS3.

For example, in a time interval T1, the column gate driving signal CDS1 is switched from a low logic level to a high logic level. The column switch CSW1 is turned on. Therefore, the LEDs L1, L4, L7 are connected to the data line DL. The row gate driving signal RDS1 is also switched from a low logic level to a high logic level. The row switch RSW1 is turned on. Therefore, the LED L1 is connected to the data line DL to form a closed loop. The data induction coil DC receives the data signal DS11 that lasts for a time length tr1 in the time interval T1, and generates the corresponding induced current I by the data signal DS11. The LED L1 may emit light according to the induced current I. In a time interval T2, the column gate driving signal CDS1 is maintained at a high logic level, and therefore the LEDs L1, L4, L7 continue to be connected to the data line DL. The row gate driving signal RDS1 is switched from a high logic level to a low logic level, and the row gate driving signal RDS2 is switched from a low logic level to a high logic level. Therefore, the LED L4 is connected to the data line DL to form a closed loop. The data induction coil DC receives the data signal DS11 that lasts for a time length tr2 in the time interval T2, and generates the corresponding induced current I by the data signal DS11. The LED L4 may emit light according to the induced current I. In a time interval T3, the column gate driving signal CDS1 is maintained at a high logic level. The row gate driving signal RDS2 is switched from a high logic level to a low logic level, and the row gate driving signal RDS3 is switched from a low logic level to a high logic level. Therefore, the LED L7 is connected to the data line DL to form a closed loop. The data induction coil DC receives the data signal DS11 that lasts for a time length tr3 in the time interval T3, and generates the corresponding induced current I by the data signal DS11. The LED L7 may emit light according to the induced current I. After the end of the time interval T3, the column gate driving signal CDS1 is switched from a high logic level to a low logic level. The column gate driving signal CDS2 is switched from a low logic level to a high logic level, and therefore the LEDs L2, L5, L8 are coupled to the data line DL one by one, and so forth.

The duration length of the data signal DS11 is positively correlated with the current value of the induced current I. That is to say, the duration length of the data signal DS11 is positively correlated with the luminance of the LEDs L1-L9. For example, in the present embodiment, the time length tr3 is greater than the time length tr1, and the time length tr1 is greater than the time length tr2. Therefore, the luminance of the LED L7 in the time interval T3 is greater than the luminance of the LED L1 in the time interval T1. The luminance of the LED L1 in the time interval T1 is greater than the luminance of the LED L4 in the time interval T2.

In the sub-display areas DA11-DA32 of the present embodiment, waveforms and timings of the column gate driving signals CDS1 for the sub-display areas DA11-DA32 are identical to each other. Waveforms and timings of the column gate driving signals CDS2 for the sub-display areas DA11-DA32 are identical to each other. Waveforms and timings of the column gate driving signals CDS3 for the sub-display areas DA11-DA32 are identical to each other. Waveforms and timings of the row gate driving signals RDS1 for the sub-display areas DA11-DA32 are identical to each other. Waveforms and timings of the row gate driving signals RDS2 for the sub-display areas DA11-DA32 are identical to each other. Waveforms and timings of the row gate driving signals RDS3 for the sub-display areas DA11-DA32 are identical to each other. Therefore, the column gate driving circuits 322_2-322_6 in the sub-display areas DA12-DA32 may be of the same circuit design as the column gate driving circuit 322_1, and the row gate driving circuits 324_2-324_6 in the sub-display areas DA12-DA32 may be of the same circuit design as the row gate driving circuit 324_1, thereby reducing the design complexity of the column gate driving circuits 322_1-322_6 and the row gate driving circuits 324_1-324_6.

Figure 6:
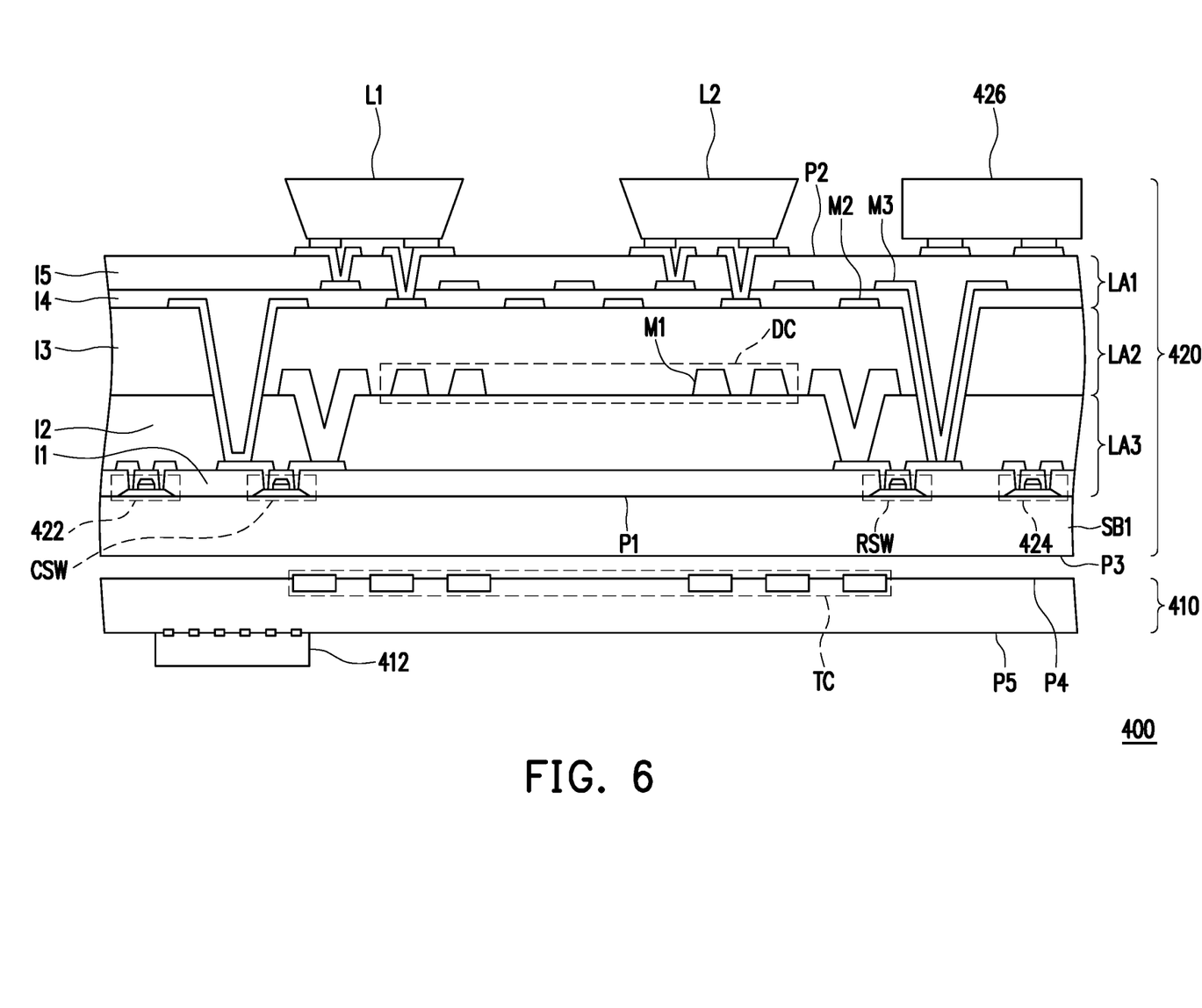
FIG. 6 is a schematic cross-sectional view of a display device according to a fourth embodiment of the disclosure.

Referring to FIG. 6, FIG. 6 is a schematic cross-sectional view of a display device according to a fourth embodiment of the disclosure. Different from the second embodiment (FIG. 3), in a display panel 420 of a display device 400, a sub-display area further includes a driving chip 426. The driving chip 426 is provided on the electrical connection surface P2. The driving chip 426 is coupled to a column gate driving circuit 422 and a row gate driving circuit 424 to drive the column gate driving circuit 422 and the row gate driving circuit 424. The driving chip 426 may be coupled to the column gate driving circuit 422 and the row gate driving circuit 424 of the switch layer LA3 via a patterned metal layer and a via (not shown).

Figure 7:
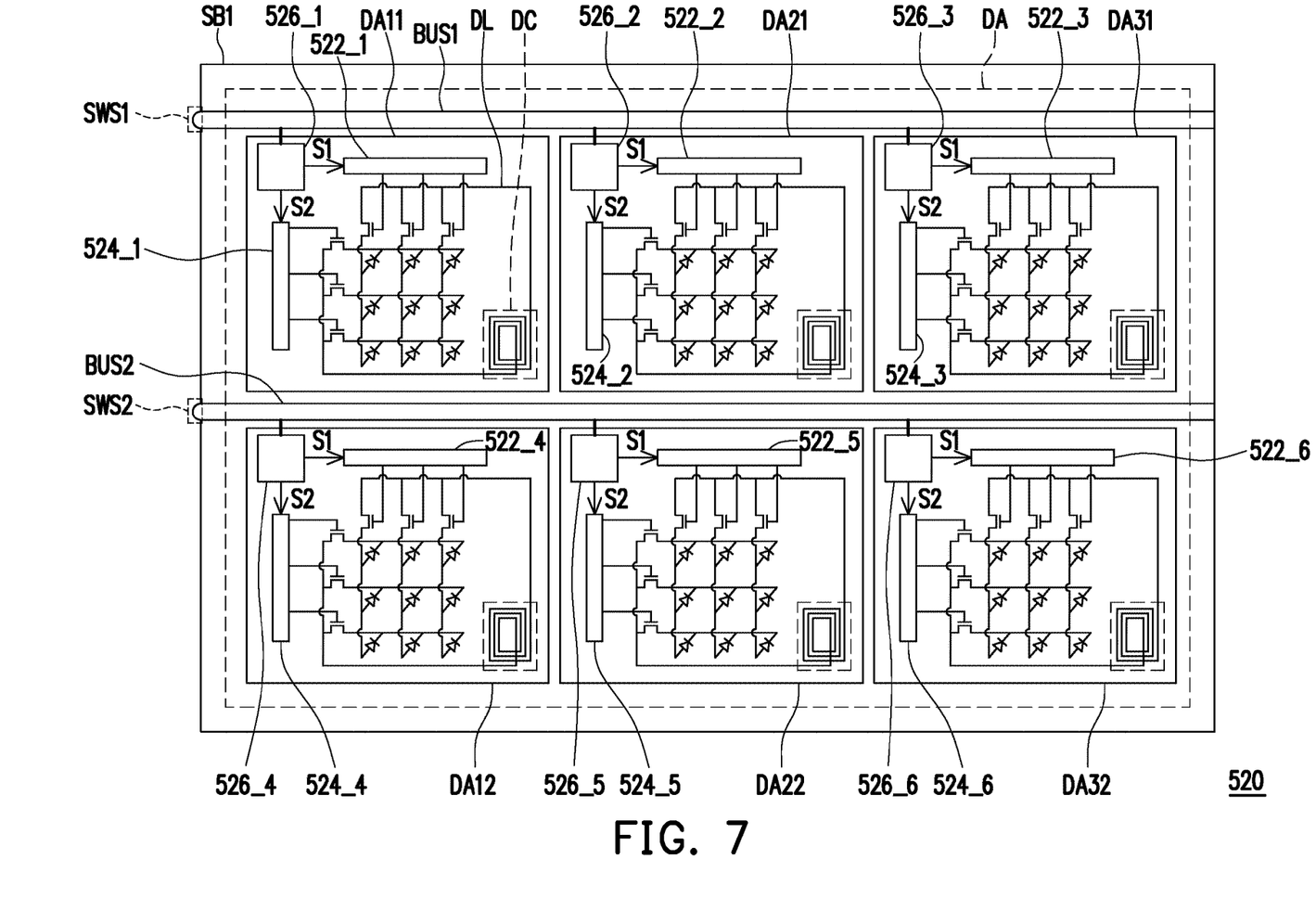
FIG. 7 is a schematic view of a display panel according to a fifth embodiment of the disclosure.

For details, referring to FIG. 7, FIG. 7 is a schematic view of a display panel according to a fifth embodiment of the disclosure. Different from the third embodiment (FIG. 4), in a display panel 520 of the present embodiment, the sub-display areas DA11-DA32 of the display area DA further include driving chips 526_1-526_6, respectively. The driving chip 526_1 is taken as an example. The driving chip 526_1 is coupled to a column gate driving circuit 522_1 and a row gate driving circuit 524_1. The driving chip 526_1 generates control signals S1, S2. The driving chip 526_1 provides the control signal S1 to the column gate driving circuit 522, and provides the control signal S2 to the row gate driving circuit 524_1. The control signals S1, S2 may include at least a signal such as a clock signal and a power voltage. The column gate driving circuit 522_1 generates a plurality of column gate driving signals (e.g., the column gate driving signals CDS1-CDS3 shown in the third embodiment) according to the control signal S1. The row gate driving circuit 524_1 generates a plurality of row gate driving signals (e.g., the row gate driving signals RDS1-RDS3 shown in the third embodiment) according to the control signal S2. In addition, the driving chips 526_2-526_6 provide the control signal S1 to the corresponding column gate driving circuits 522_2-522_6 respectively, and provide the control signal S2 to the corresponding row gate driving circuits 524_2-524_6 respectively.

In the present embodiment, the display panel 520 further includes connection structures SWS1, SWS2 for electrically coupling an electrical connection surface (such as the electrical connection surface P2 in FIG. 3 and FIG. 6) to a second surface (such as the second surface P3 in FIG. 3 and FIG. 6) of the substrate SB1. The driving chips 526_1-526_6 located on the electrical connection surface are coupled to the second surface of the substrate SB1 by power transmission lines BUS1, BUS2 and the connection structures to receive an external power source, thereby operating by using the external power source. In the present embodiment, the connection structures SWS1, SWS2 are side wiring structures located on a side of the substrate SB1. The driving chips 522_1-522_6 may receive the external power source on the second surface of the substrate SB1 via the connection structures SWS1, SWS2. For example, the driving chips 526_1-526_3 may be connected to the connection structure SWS1 via the power transmission line BUS1 to receive the external power source on the second surface of the substrate SB1. The driving chips 526_4-526_6 may be connected to the connection structure SWS2 via the power transmission line BUS2 to receive the external power source on the second surface of the substrate SB1. For convenience of description, the number of the power transmission lines and the number of the connection structures of the present embodiment are 2. The number of the power transmission lines and the number of the connection structures of the disclosure may be one or more, and shall not be limited by the present embodiment.

Figure 8:
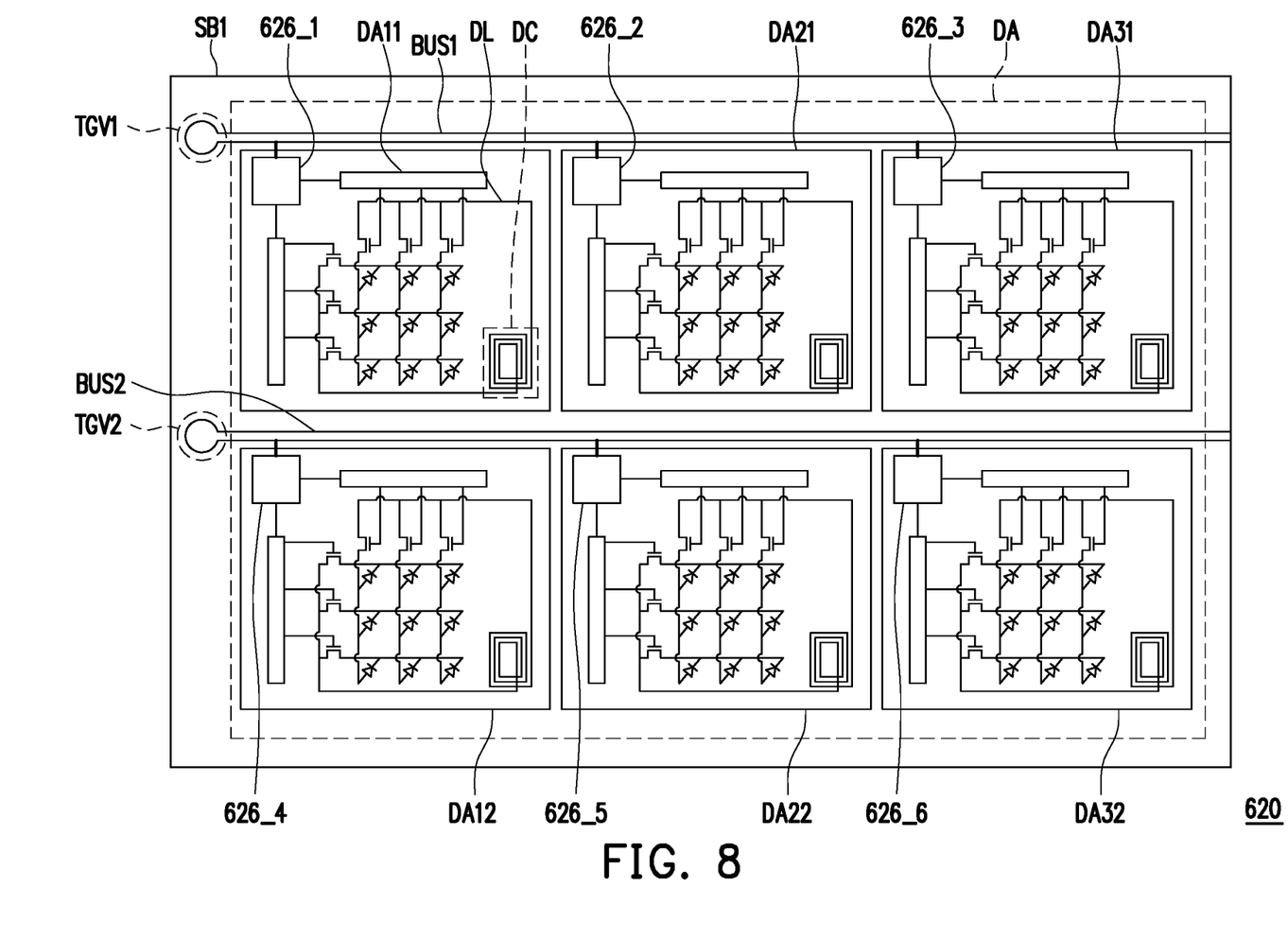
FIG. 8 is a schematic view of a display panel according to a sixth embodiment of the disclosure.

Referring to FIG. 8, FIG. 8 is a schematic view of a display panel according to a sixth embodiment of the disclosure. Different from the fifth embodiment (FIG. 7), in the present embodiment, the connection structures TGV1, TGV2 are through-panel vias located in a display panel 620. Driving chips 626_1-626_6 may receive an external power source on the second surface of the substrate SB1 via the through-panel vias. The connection structures TGV1, TGV2 of the present embodiment may be implemented, for example, by a through-glass via (TGV). For example, the driving chips 626_1-626_3 may be connected to the connection structure TGV1 via the power transmission line BUS1 to receive the external power source on the second surface of the substrate SB1. The driving chips 626_4-626_6 may be connected to the connection structure TGV1 via the power transmission line BUS2 to receive the external power source on the second surface of the substrate SB1.

Figure 9:
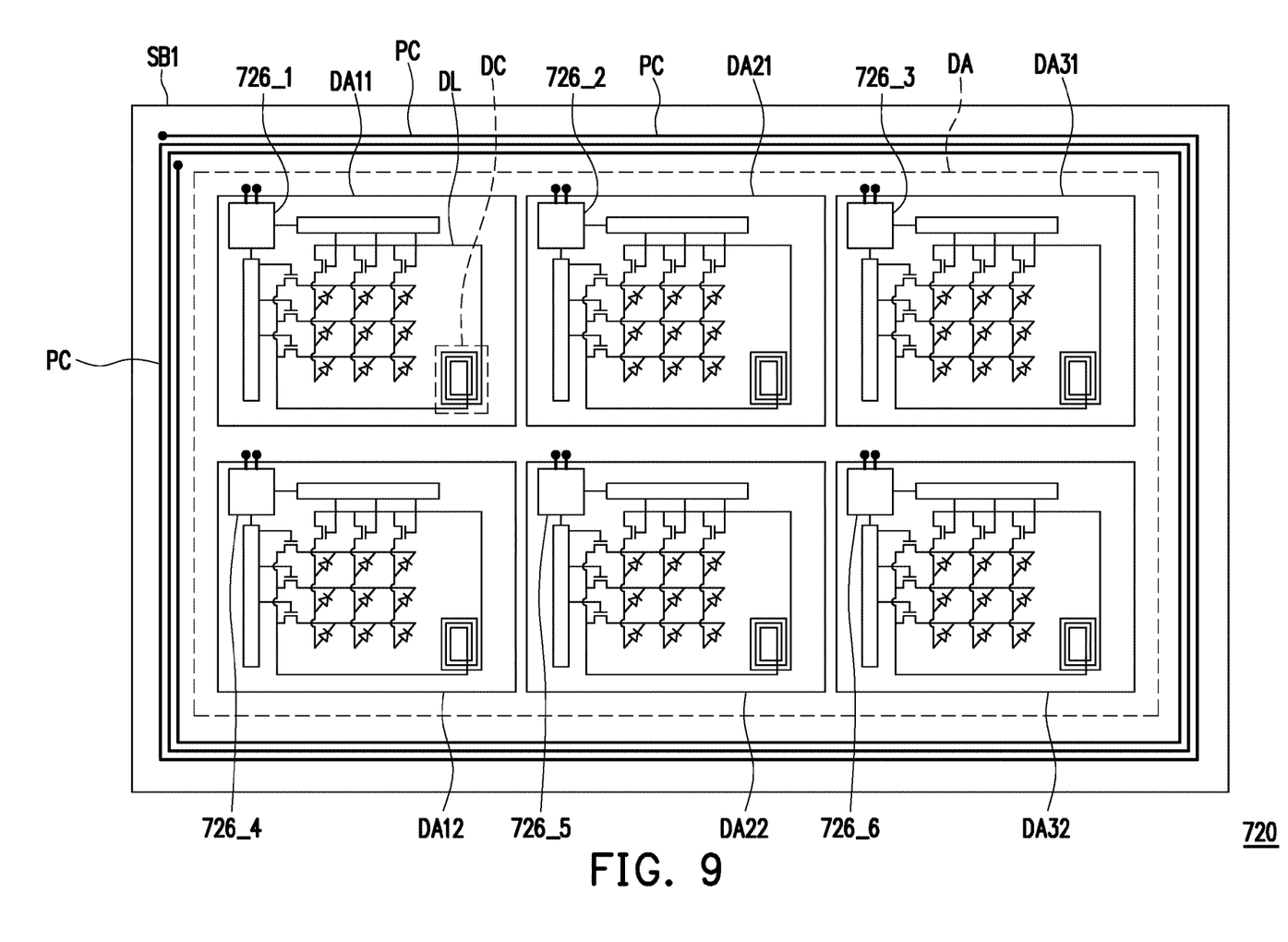
FIG. 9 is a schematic view of a display panel according to a seventh embodiment of the disclosure.

Referring to FIG. 9, FIG. 9 is a schematic view of a display panel according to a seventh embodiment of the disclosure. Different from the fifth embodiment (FIG. 7) and the sixth embodiment (FIG. 8), in a display panel 720, driving chips 726_1-726_6 receive an inductive power source wirelessly. The driving chips 726_1-726_6 operate by using the inductive power source. Specifically, the display panel 720 further includes a power induction coil PC. The power induction coil PC surrounds the display area DA. The power induction coil PC surrounds the display area DA and is coupled to the driving chips 726_1-726_6. The power induction coil PC is configured to receive a power signal by wireless sensing to generate the inductive power source. In some embodiments, the power induction coil PC is located in the display area DA and surrounds the sub-display areas DA11-DA32.

The cross-sectional area of the power induction coil PC is significantly greater than the cross-sectional area of the data induction coil DC. The induction frequency of the power induction coil PC is significantly smaller than the induction frequency of the data induction coil DC. That is to say, the frequency of the power signal received by the power induction coil PC is smaller than the frequency of the data signal. For example, the power signal has a frequency of 1 kHz and the data signal has a frequency of 1 MHz. In this way, the data induction coil DC does not generate an erroneous induced current due to receiving the power signal.

Based on the foregoing, in the disclosure, the display area of the display panel is divided into the sub-display areas. Each sub-display area includes the LEDs, the data line, the column switches, and the row switches. In the disclosure, one of the LEDs is selected as the selected LED by the row switches and the column switches. The selected LED is coupled to the data line to form a closed loop to cause the selected LED to emit light according to the induced current. In this way, the display device of the disclosure can avoid crosstalk and meet design requirements of high resolution.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:
1. A display device, comprising:
a data signal transmitter, configured to transmit a plurality of data signals; and
a display panel, wherein a display area of the display panel is divided into a plurality of sub-display areas, the sub-display areas are arranged in a two-dimensional array, and each of the sub-display areas comprises:
a plurality of light emitting diodes (LED), arranged in a two-dimensional array;
a data line, wherein a portion of the data line is formed as a data induction coil to receive one of the data signals by wireless sensing; and a plurality of column switches and a plurality of row switches, coupled between the data line and a plurality of corresponding LEDs respectively, wherein the display panel selects one of the LEDs as a selected LED by the row switches and the column switches, a first terminal of the selected LED is connected to a first terminal of the induction coil and a second terminal of the selected LED is connected to a second terminal of the induction coil, so as to form a closed loop between the selected LED and the induction coil, and the closed loop generates an induced current according to one of the data signals and causes the selected LED to emit light according to the induced current.

2. The display device according to claim 1, wherein the LEDs of the respective sub-display areas do not emit light simultaneously.

3. The display device according to claim 1, wherein each of the sub-display areas further comprises:
a column gate driving circuit, coupled to the column switches, and configured to generate a plurality of column gate driving signals and correspondingly provide the column gate driving signals to the column switches; and
a row gate driving circuit, coupled to the row switches, and configured to generate a plurality of row gate driving signals and correspondingly provide the row gate driving signals to the row switches.

4. The display device according to claim 3, wherein a duty cycle of the column gate driving signals is greater than a duty cycle of the row gate driving signals.

5. The display device according to claim 3, wherein in the sub-display areas, a first column gate driving signal in a first sub-display area is the same as a first column gate driving signal in a second sub-display area, and a first row gate driving signal in the first sub-display area is the same as a first row gate driving signal in the second sub-display area.

6. The display device according to claim 3, wherein the column gate driving circuit receives a first external control signal via a circuit interface and is driven according to the first external control signal, and the row gate driving circuit receives a second external control signal via the circuit interface and is driven according to the second external control signal.

7. The display device according to claim 3, wherein each of the sub-display areas further comprises:
a driving chip, provided on the display panel and coupled to the column gate driving circuit and the row gate driving circuit for driving the column gate driving circuit and the row gate driving circuit.

8. The display device according to claim 7, wherein
the display panel comprises a substrate,
each of the sub-display areas is provided on a first surface of the substrate, and
each of the sub-display areas is electrically coupled to the LEDs via an electrical connection surface, such that the LEDs are correspondingly coupled to the column switches and the row switches.

9. The display device according to claim 8, wherein
the display panel comprises at least one connection structure for electrically coupling the electrical connection surface to a second surface opposite to the first surface,
the at least one connection structure is a side wiring structure or a through-panel via,
the driving chip is provided on the electrical connection surface, and the driving chip is coupled to the second surface via one of a power transmission line and the at least one connection structure, thereby receiving an external power source and operating by using the external power source.

10. The display device according to claim 7, wherein the display panel further comprises:
a power induction coil, surrounding the display area or surrounding the sub-display areas in the display area, and coupled to the driving chip for receiving a power signal by wireless sensing to generate an inductive power source,
wherein the driving chip operates by using the inductive power source.

11. The display device according to claim 10, wherein a frequency of the power signal is smaller than a frequency of the data signals.

12. The display device according to claim 1, wherein the data signal transmitter comprises:
a plurality of transmitting coils, each configured to transmit one of the data signals and each configured corresponding to the data induction coil of each of the sub-display areas.

13. A display device, comprising:
a data signal transmitter, configured to transmit a plurality of data signals; and
a display panel, wherein a display area of the display panel is divided into a plurality of sub-display areas, the sub-display areas are arranged in a two-dimensional array, the sub-display areas are provided on a first surface of a substrate in the display panel, and each of the sub-display areas comprises:
a connection layer;
a plurality of light emitting diodes (LED), arranged in a two-dimensional array and respectively provided on an electrical connection surface of the connection layer;
a data receiving layer, comprising a data line, wherein a portion of the data line is formed as a data induction coil to receive one of the data signals by wireless sensing; and
a switch layer, comprising a plurality of column switches and a plurality of row switches, wherein the column switches and the row switches are coupled between the data line and a plurality of corresponding LEDs respectively,
wherein the display panel selects one of the LEDs as a selected LED by the row switches and the column switches, a first terminal of the selected LED is connected to a first terminal of the induction coil and a second terminal of the selected LED is connected to a second terminal of the induction coil, so as to form a closed loop between the selected LED and the induction coil, and the closed loop generates an induced current according to the data signal and causes the selected LED to emit light according to the induced current.

14. The display device according to claim 13, wherein the LEDs do not emit light simultaneously.

15. The display device according to claim 13, wherein the data receiving layer and the switch layer are provided between an internal connection layer and the first surface.

16. The display device according to claim 15, wherein:
the display panel comprises at least one connection structure for electrically coupling the electrical connection surface to a second surface opposite to the first surface, the at least one connection structure is a side wiring or a through-panel via, and the driving chip is coupled to the second surface via one of a power transmission line and the at least one connection structure, thereby receiving an external power source and operating by using the external power source.

17. The display device according to claim 13, wherein the switch layer further comprises:

a column gate driving circuit, coupled to the column switches, and configured to generate a plurality of column gate driving signals and correspondingly provide the column gate driving signals to the column switches; and a row gate driving circuit, coupled to the row switches, and configured to generate a plurality of row gate driving signals and correspondingly provide the row gate driving signals to the row switches.

18. The display device according to claim 17, wherein a duty cycle of the column gate driving signals is greater than a duty cycle of the row gate driving signals.

19. The display device according to claim 17, wherein in the sub-display areas, a first column gate driving signal in a first sub-display area is the same as a first column gate driving signal in a second sub-display area, and a first row gate driving signal in the first sub-display area is the same as a first row gate driving signal in the second sub-display area.

20. The display device according to claim 17, wherein the column gate driving circuit receives a first external control signal via a circuit interface and is driven according to the first external control signal, and the row gate driving circuit receives a second external control signal via the circuit interface and is driven according to the second external control signal.

21. The display device according to claim 20, wherein each of the sub-display areas further comprises:

a driving chip, provided on the electrical connection surface and coupled to the column gate driving circuit and the row gate driving circuit, and configured to drive the column gate driving circuit and the row gate driving circuit.

22. The display device according to claim 21, wherein the display panel comprises:

a power induction coil, surrounding the display area or surrounding the sub-display areas in the display area, and coupled to the driving chip, and configured to receive a power signal by wireless sensing to generate an inductive power source, wherein the driving chip operates by using the inductive power source.

23. The display device according to claim 22, wherein a frequency of the power signal is smaller than a frequency of the data signals.

24. The display device according to claim 13, wherein the data signal transmitter comprises:

a plurality of transmitting coils, each configured to transmit one of the data signals and each configured corresponding to the data induction coil of each of the sub-display areas.

\* \* \* \* \*